(12) United States Patent
Mason et al.

(10) Patent No.: US 8,550,825 B2
(45) Date of Patent: Oct. 8, 2013

(54) ELECTRICAL INTERCONNECT DEVICE

(75) Inventors: Jeffery W. Mason, North Attleboro, MA (US); Wayne S. Alden, III, Whitman, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 129 days.

(21) Appl. No.: 13/080,492

(22) Filed: Apr. 5, 2011

(65) Prior Publication Data
US 2012/0258616 A1 Oct. 11, 2012

(51) Int. Cl.
*H01R 12/00* (2006.01)

(52) U.S. Cl.
USPC .............................................. 439/66; 439/67

(58) Field of Classification Search
USPC .................................. 439/71, 66, 67
See application file for complete search history.

(56) References Cited

U.S. PATENT DOCUMENTS

| | | | |
|---|---|---|---|
| 6,669,490 B1 * | 12/2003 | DelPrete et al. ................ 439/86 |
| 6,989,681 B2 * | 1/2006 | Maekawa et al. ........ 324/754.03 |
| 7,549,870 B2 | 6/2009 | Mason et al. |
| 7,572,131 B2 | 8/2009 | Alden, III et al. |
| 7,722,360 B2 | 5/2010 | Millard et al. |
| 7,726,976 B2 | 6/2010 | Mason et al. |
| 7,785,111 B2 | 8/2010 | Hilty et al. |
| 7,815,442 B2 * | 10/2010 | Hsu et al. ........................ 439/71 |
| 8,007,287 B1 * | 8/2011 | Champion et al. ............. 439/66 |
| 8,063,481 B2 * | 11/2011 | Li ................................. 257/700 |
| 2004/0266224 A1 * | 12/2004 | Watson ........................... 439/66 |
| 2012/0257366 A1 * | 10/2012 | Mason et al. ................. 361/807 |

* cited by examiner

*Primary Examiner* — Hien Vu

(57) ABSTRACT

An electrical interconnect device includes a substrate that has opposite first and second outer surfaces. Arrays of conductive elastomeric columns are held by the substrate. Each of the columns has opposite first and second ends. The elastomeric columns are internally conductive between the first and second ends. A shield is mounted exterior of the first outer surface of the substrate with the shield having an insulative carrier that holds an array of conductive pads arranged in a complementary pattern as the array of elastomeric columns. The conductive pads have inner surfaces and outer surfaces. The shield is positioned relative to the substrate such that the inner surfaces of the conductive pads engage the first ends of corresponding elastomeric columns. The outer surfaces are configured to engage corresponding mating contacts of an electrical component.

18 Claims, 5 Drawing Sheets

ELECTRICAL INTERCONNECT DEVICE

BACKGROUND OF THE INVENTION

The subject matter herein relates generally to electrical interconnect devices for use between opposed arrays of contacts.

Interconnect devices are used to provide electrical connection between two or more opposing arrays of contacts for establishing at least one electrical circuit, where the respective arrays may be provided on a device, printed circuit board, Pin Grid Array (PGA), Land Grid Array (LGA), Ball Grid Array (BGA), and the like. In one interconnect technique, the electrical connection is provided by an interconnect device that is physically interposed between corresponding electrical contacts of the opposing arrays of contacts. However, the electrical connection may be unreliable due to height variations between electrical contacts of the opposing arrays, variations in thickness of a substrate supporting either of the opposing arrays or the conductive elements of the interconnect device, warping of a substrate of either of the opposing arrays, and the like.

At least some known interconnect devices use an array of elastomeric columns supported on a substrate. The elastomeric columns may be compressed to establish reliable contact between the opposing contacts. In some known interconnect devices, the elastomeric columns are conductive and provide the electrical connection. In other known interconnect devices, the elastomeric columns are non-conductive and the electrical connection is provided via a separate contact or trace. The interconnect devices are capable of accommodating size constraints, such as related to the reduced physical size of many electrical devices.

In known interconnect devices using conductive elastomeric columns, the elastomeric columns are directly engaged with the contacts. With use, the elastomeric column conforms to the contact surface and, over time, bonds to the contact surface due to the high temperature created between the two elements. Once the two elements are bonded, it is difficult to remove the components from one another. Additionally, polymer material of the elastomeric column transfers to the contact surface, and a portion of the polymer material may be permanently adhered to the contact surface.

A need remains for an electrical interconnect device that reduces damage or degradation to the elastomeric columns during use of the electrical interconnect device. A need remains for an electrical interconnect device that accommodates many mating and unmating cycles with other electrical components.

BRIEF DESCRIPTION OF THE INVENTION

In one embodiment, an electrical interconnect device is provided having a substrate that has opposite first and second outer surfaces. Arrays of conductive elastomeric columns are held by the substrate. Each of the columns has opposite first and second ends. The elastomeric columns are internally conductive between the first and second ends. A shield is mounted exterior of the first outer surface of the substrate with the shield having an insulative carrier that holds an array of conductive pads arranged in a complementary pattern as the array of elastomeric columns. The conductive pads have inner surfaces and outer surfaces. The shield is positioned relative to the substrate such that the inner surfaces of the conductive pads engage the first ends of corresponding elastomeric columns. The outer surfaces are configured to engage corresponding mating contacts of an electrical component.

In another embodiment, an electrical interconnect device is provided having a substrate that has opposite first and second outer surfaces. Arrays of conductive elastomeric columns are held by the substrate. Each of the columns has opposite first and second ends. The elastomeric columns are internally conductive between the first and second ends. A shield is mounted exterior of the first outer surface of the substrate with the shield having an insulative carrier that holds an array of conductive pads. The carrier has first and second surfaces. The conductive pads engage the first ends of corresponding elastomeric columns. The conductive pads are configured to engage corresponding mating contacts of an electrical component. The carrier floats above the first outer surface such that the inner surface moves closer to the first outer surface as the electrical component is connected to the electrical interconnect device.

In a further embodiment, an electrical interconnect system is provided having a main electrical component that has an array of contacts. The electrical interconnect system also includes an electrical interconnect device having a substrate that has opposite first and second outer surfaces. An array of conductive elastomeric columns is held by the substrate each having opposite first and second ends. A shield is mounted exterior of the first outer surface of the substrate with the shield having an insulative carrier that holds an array of conductive pads having inner surfaces and outer surfaces. The shield is positioned relative to the substrate such that the inner surfaces of the conductive pads engage the first ends of corresponding elastomeric columns. The outer surfaces are configured to engage corresponding mating contacts of a secondary electrical component. The second ends of the elastomeric columns engage corresponding contacts of the main electrical component to electrically interconnect the secondary electrical component and the main electrical component.

DETAILED DESCRIPTION OF THE INVENTION

Figure 1:
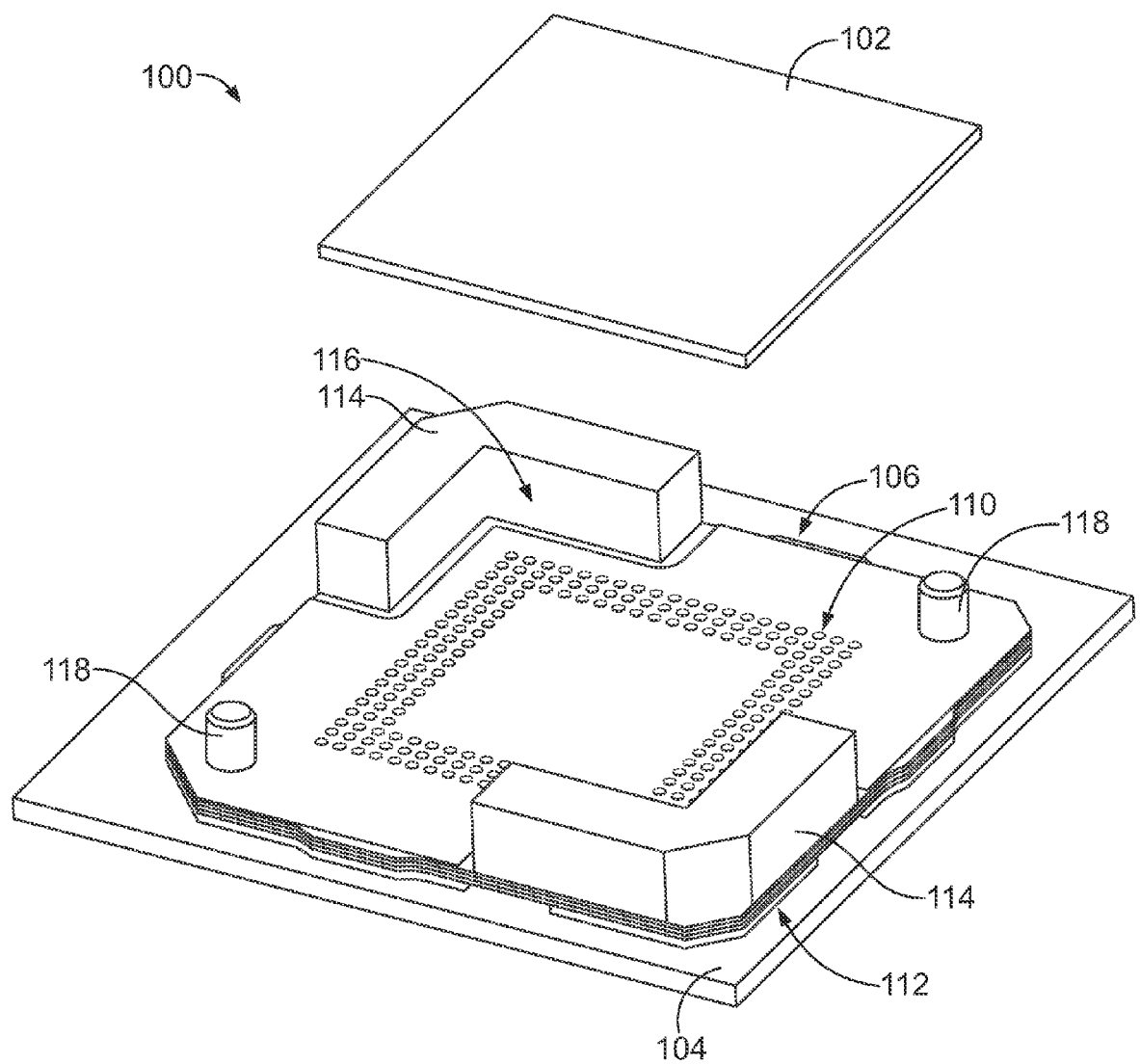
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device 106 sandwiched therebetween. The interconnect device 106 is illustrated mounted to the second electrical component 104. The first electrical component 102 is illustrated poised for mounting to the interconnect device 106. The first and second electrical components 102, 104 both have arrays of contacts, such as land grid arrays, ball grid arrays and the like that are electrically connected together by the interconnect device 106.

In the illustrated embodiment, the first electrical component 102 is an electronic package, such as a chip or processor. The second electrical component 104 is a circuit board. The interconnect device 106 constitutes a socket that is mounted to the circuit board and is configured to receive the chip. In an exemplary embodiment, the electrical interconnect system 100 constitutes a testing system, where the interconnect device 106 is a test socket mounted to a main circuit board, represented by the second electrical component 104. The first electrical component 102 is a test chip configured to be tested in the test socket. One example of a test socket is a burn-in socket used for testing components of the test chip, such as the materials used for manufacturing the chip, at high temperatures, such as a temperature of 150° C. or higher. The test socket is configured for a high volume of cycles during its lifetime, wherein many different test chips are configured to be tested by the test socket. In alternative embodiments, other types of electrical components may be interconnected by the interconnect device 106. For example, both the first and second electrical components 102, 104 may be circuit boards.

The interconnect device 106 has a first mating surface 110 and a second mating surface 112. The first mating surface 110 is configured to be electrically connected to the first electrical component 102. The second mating surface 112 is configured to be electrically connected to the second electrical component 104. The interconnect device 106 includes guide walls 114 that define a socket or receptacle 116 that receives the first electrical component 102. The interconnect device 106 includes alignment features 118 that align the first electrical component 102 within the socket 116. In the illustrated embodiment, the alignment features 118 constitute pins or posts. The guide walls 114 also help align the first electrical component 102 in the socket 116.

Figure 2:
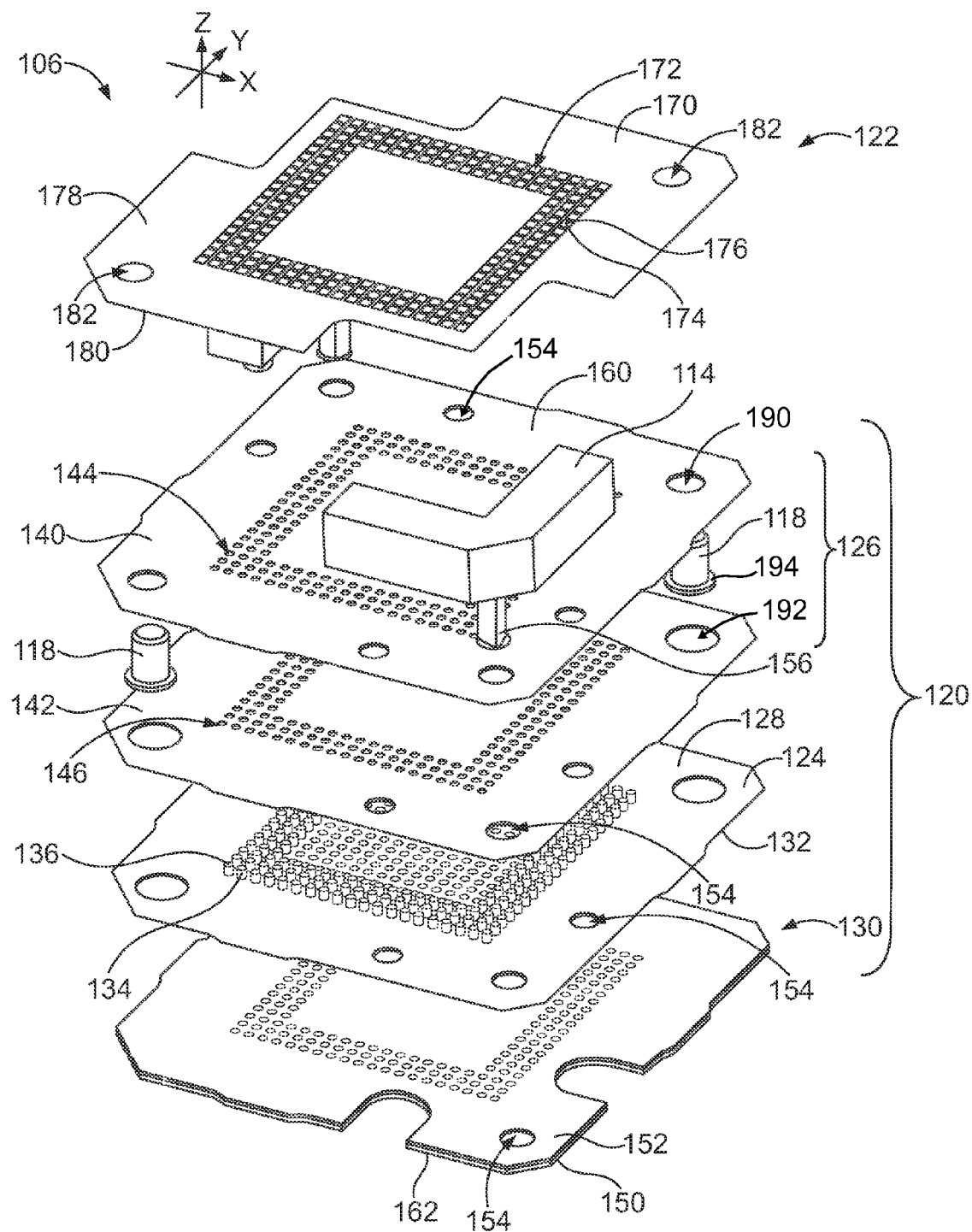
FIG. 2 is an exploded view of the interconnect device of the electrical interconnect system shown in FIG. 1.

FIG. 2 is an exploded view of the interconnect device 106 in accordance with an exemplary embodiment. The interconnect device 106 includes a substrate 120 including one or more layers and a shield 122 that is configured to be mounted to the substrate 120.

The substrate 120 includes one or more inner layers 124, one or more outer layers 126 on a first side 128 of the inner layers 124, and one or more outer layers 130 on a second side 132 of the inner layers 124. The first side 128 generally faces the first electrical component 102 (shown in FIG. 1) and the second side 132 generally faces the second electrical component 104 (shown in FIG. 1).

The inner layer 124 includes an insulator or carrier that holds a plurality of elastomeric columns 134. In an exemplary embodiment, the inner layer 124 is fabricated from an insulative material, such as a polyimide material that may be arranged as a polyimide film, such as a Kapton® material. The elastomeric columns 134 are arranged in an array having a predetermined pattern or layout that corresponds to the array of contacts of the first electrical component 102 and the second electrical component 104. The elastomeric columns 134 extend from both the first and second sides 128, 132. The elastomeric columns 134 extend between a first end 136 and a second end 138 (shown in FIG. 5) opposite the first end 136. In an exemplary embodiment, the columns 134 are frustoconically shaped, being wider about the mid-section and narrower at the first and second ends 136, 138. The columns 134 are held at the mid-section by the inner layer 124. In an exemplary embodiment, the columns 134 are conductive elastomeric columns, such as columns fabricated from a mixture of an elastic material and conductive particles. The columns 134 provide conductive paths between the first and second ends 136, 138. In an exemplary embodiment, the columns 134 are metalized particle interconnects. The columns 134 are at least partially compressible when the first electrical component 102 is mounted to the interconnect device 106.

In the illustrated embodiment, the outer layers 126 include two coverlays 140, 142 that may be secured together using adhesive layers. The coverlays 140, 142 are secured to the first side 128 of the inner layer 124, such as by using an adhesive layer. Other layers may be provided in alternative embodiments. The coverlays 140, 142 constitutes a mechanical stop that limits the amount of compression of the elastomeric columns 134 when the first electrical component 102 is being mounted to the interconnect device 106. The coverlays 140, 142 have a plurality of openings 144, 146 that are arranged in a complementary pattern to the columns 134. The columns 134 are received in corresponding openings 144, 146 when the coverlays 140, 142 are attached to the inner layer 124.

In an exemplary embodiment, the two coverlays 140, 142 cooperate to capture the alignment features 118 therebetween. For example, the outer coverlay 140 includes smaller openings 190 for receiving the alignment features 118 than the openings 192 in the inner coverlay 142 that receive the alignment features 118. The alignment feature 118 includes a flange 194 that is received in the opening 192 in the inner coverlay 142. The flange 194 is captured beneath the outer coverlay 140.

In alternative embodiments, a single coverlay may be used rather than the two part coverlay. The alignment features 118 may be held in place relative to the substrate 120 by other means in alternative embodiments.

In the illustrated embodiment, the outer layers 130 include a coverlay 150 and an adhesive layer 152 that secures the coverlay 150 to the second side 132 of the inner layer 124. The outer layer 130 may have other layers in alternative embodiments.

The inner layer 124 and outer layers 126, 130 include a plurality of apertures 154 extending therethrough. The apertures 154 receive various features or components that align the layers 124, 126, 130 with one another and/or with the first and second electrical components 102, 104. For example, the alignment features 118 may be received in corresponding apertures 154. Additionally, the guide walls 114 may includes posts 156 that are received in corresponding apertures 154.

When assembled, the outer layers 126, 130 are positioned on, and may be secured to, the inner layer 124. When assembled, the outer layer 126 defines a first outer surface 160 of the substrate 120 and the outer layer 130 defines a second outer surface 162 of the substrate 120. The shield 122 is configured to be mounted exterior of the first outer surface 160. The shield 122 is configured to be interspersed between the substrate 120 and the first electrical component 102. In the illustrated embodiment, the second outer surface 162 is configured to be mounted to the second electrical component 104. In alternative embodiments, a second shield (not shown), that may be similar or identical to the shield 122 may be mounted exterior of the second outer surface 162.

The shield 122 includes an insulative carrier 170 holding an array of conductive pads 172. The conductive pads 172 are arranged in a complementary pattern as the array of elastomeric columns 134. The conductive pads 172 have inner surfaces 174 (shown in FIG. 5) and outer surfaces 176 opposite the inner surfaces 174. The shield 122 is positioned relative to the substrate 120 such that the inner surfaces 174 of the conductive pads 172 engage the first ends 136 of corresponding elastomeric columns 134. The outer surfaces 176 are configured to engage corresponding mating contacts of the first electrical component 102 (shown in FIG. 1). The conductive pads 172 define an electrical interface between the first electrical component 102 and the elastomeric columns 134. The conductive pads 172 are manufactured from a conductive material, such as copper. The conductive pads 172 are physically held together by the carrier 170 such that each of the conductive pads 172 may be mounted to the substrate 120 as a unit. The conductive pads 172 are arranged on the carrier 170 such that the conductive pads 172 are spaced apart from one another. The conductive pads 172 remain attached to the carrier 170 when mounted to the substrate 120. The conductive pads 172 are electrically isolated from one another by the spacing between the conductive pads 172.

The carrier 170 has a first surface 178 and a second surface 180 opposite the first surface 178. The second surface 180 generally faces the substrate 120. The first surface 178 generally faces the first electrical component 102 when mounted to the interconnect device 106. Optionally, the conductive pads 172 may be provided on the first surface 178. For example, the inner surfaces 174 of the conductive pads 172 may extend along, and be secured to, the first surface 178. Alternatively, the conductive pads 172 may be provided on the second surface 180. In other alternative embodiments, the conductive pads 172 may be held at an intermediate position between the first and second surfaces 178, 180.

The carrier 170 is manufactured from a dielectric material, such as a polyimide. The carrier 170 is an insulator that holds the conductive pads 172. In an exemplary embodiment, the carrier 170 is a thin film such as Kapton® polyimide film. The carrier 170 includes one or more shield alignment features 182 that engage the alignment features 118 to position the shield 122 with respect to the substrate 120. In the illustrated embodiment, the shield alignment features 182 constitute apertures through the carrier 170. The apertures receive the posts defining the alignment features 118 to position the shield 122 exterior of the first outer surface 160.

In an exemplary embodiment, the carrier 170 is held generally parallel to the substrate 120 with the conductive pads 172 aligned above, and engaging the first ends 136 of the elastomeric columns 134. In an exemplary embodiment, and as described in further detail below, the carrier 170 is able to float, for example in the Z direction, above the substrate 120. The alignment features 118 hold the position of the carrier 170, for example the carrier 170 is held in the X and Y directions by the alignment features 118, but the carrier 170 is able to move toward and away from the first outer surface 160, such as when the first electrical component 102 is mated to the interconnect device 106. In an exemplary embodiment, when the first electrical component 102 is mated to the interconnect device 106, the first electrical component 102 compresses the elastomeric columns 134 moving the first electrical component 102 closer to the first outer surface 160 as the first electrical component 102 is moved to a fully mated position. The carrier 170 moves with the first electrical component 102 toward the first outer surface 160 as the first electrical component 102 is moved to the final mated position. In an exemplary embodiment, the conductive pads 172 remain pressed against the first ends 136 of the elastomeric columns 134 during the entire time the carrier 170 and first electrical component 102 are pressed toward the first outer surface 160. When the carrier 170 bottoms out against the first outer surface 160, the first electrical component 102 is in the final mated position and further compression of the elastomeric columns 134 is restricted by the mechanical stop defined by the coverlay 140 and the carrier 170.

Figure 3:
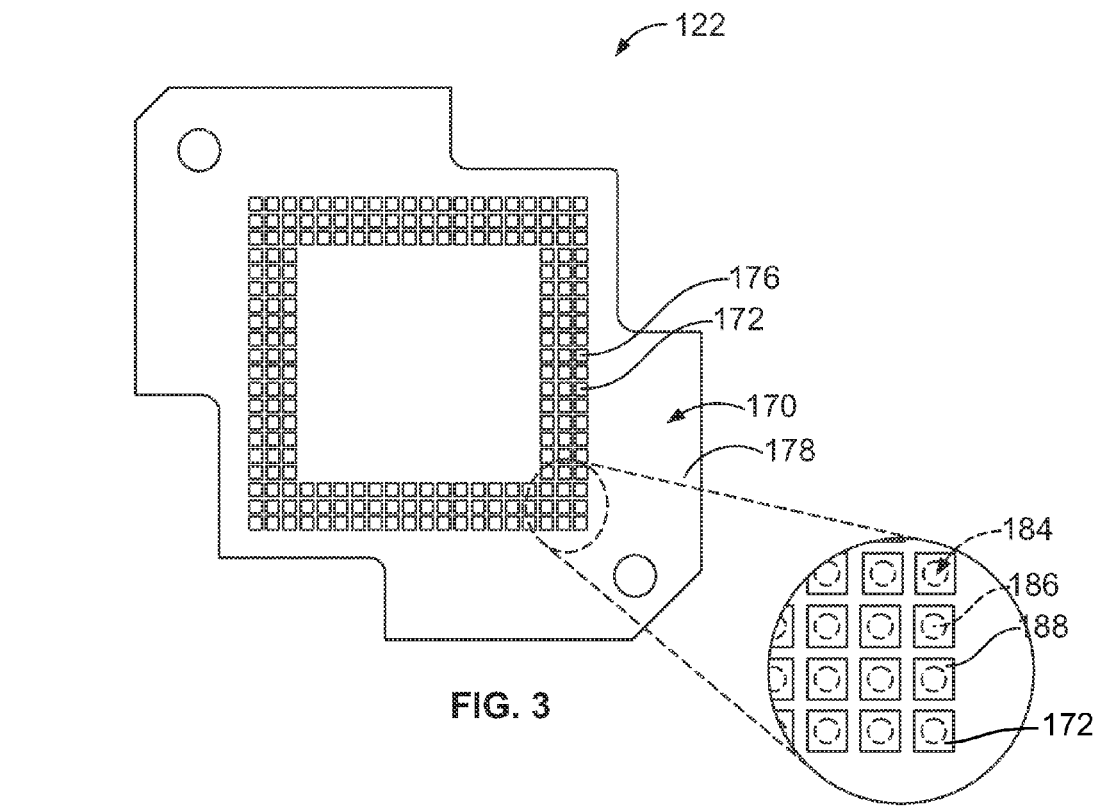
FIG. 3 is a top perspective view of a shield for the interconnect device shown in FIG. 2.
Figure 4:
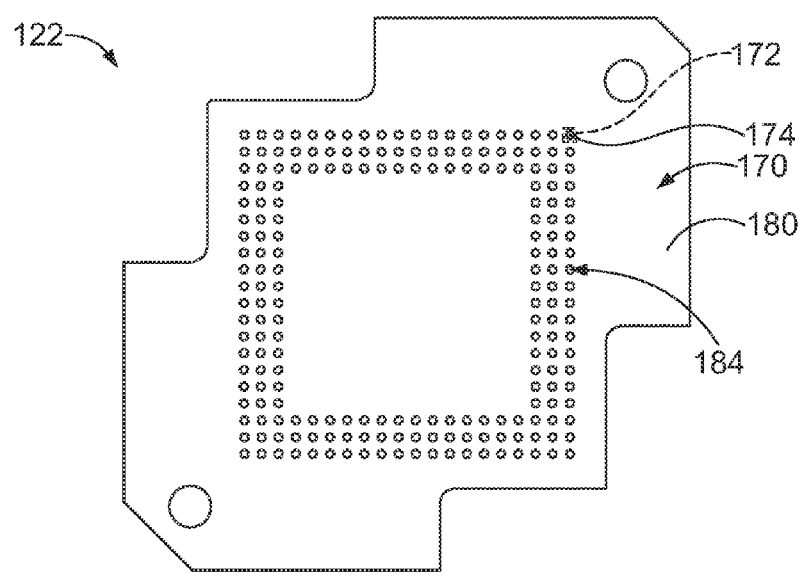
FIG. 4 is a bottom perspective view of the shield shown in FIG. 3.

FIGS. 3 and 4 are top and bottom views, respectively, of the shield 122. The first surface 178 of the carrier 170 is illustrated in FIG. 3. The conductive pads 172 are shown on the first surface 178 of the carrier 170. The outer surfaces 176 of the conductive pads 172 are exposed along the first surface of the carrier 170. Any number of conductive pads 172 may be provided. The conductive pads 172 may be arranged in any pattern, depending on the particular application. The second surface 180 of the carrier 170 is illustrated in FIG. 4.

In an exemplary embodiment, the carrier 170 includes an array of voids 184 extending between the first and second surfaces 178, 180. The voids 184 are formed entirely through the carrier 170. The voids 184 are aligned with corresponding conductive pads 172. The inner surfaces 174 of the conductive pads 172 are exposed by the voids 184. The voids 184 are configured to receive the first ends 136 of the elastomeric columns 134 (both shown in FIG. 2) when the shield 122 is mounted to the substrate 120 (shown in FIG. 2). The elastomeric columns 134 are received in corresponding voids 184 to engage the conductive pads 172.

As shown in FIG. 3, an enlarged area of the shield 122 is illustrated. The conductive pads 172 cover the voids 184. The conductive pads 172 are secured to the portion of the carrier 170 surrounding the voids 184. Each of the conductive pads 172 has a void portion 186 and a carrier portion 188 that surrounds the void portion. The void portions 186 are aligned with the corresponding voids 184. The carrier portions 188 are aligned with the portions of the carrier 170 surrounding the voids 184. The conductive pads 172 are secured to the carrier 170 at the carrier portions 188. In an exemplary embodiment, the conductive pads 172 are sized and shaped differently than the voids 184. For example, the conductive pads 172 are larger than the voids 184 to increase the surface area of the carrier portions 188. Having a large surface area for the carrier portions 188 may increase the mechanical stability of the conductive pads 172. In an exemplary embodiment, the conductive pads 172 are secured to the carrier 170 by bonding the conductive pads 172 to the carrier 170. The conductive pads 172 may be secured to the carrier 170 by other means in alternative embodiments.

In an exemplary embodiment, the shield 122 is manufactured by providing a copper clad on a polyimide film that defines the carrier 170. The copper clad is etched or otherwise selectively removed, leaving the conductive pads 172 on the carrier 170. The voids 184 are formed in the carrier 170 either before or after the conductive pads 172 are formed and secured to the carrier 170. The voids 184 may be formed by laser drilling the polyimide film. The voids 184 may be formed by other processes in alternative embodiments. In the illustrated embodiment, the voids 184 are circular in cross-section having a predetermined diameter and spacing therebetween. The conductive pads 172 are square in cross-section having a width that is greater than the diameter of the voids 184. The conductive pads 172 have a spacing therebetween that is less than the spacing between the voids 184. The conductive pads 172 have a greater surface area than the cross-sectional area of the voids 184. The shield 122 may be manufactured by other processes in alternative embodiments.

Figure 5:
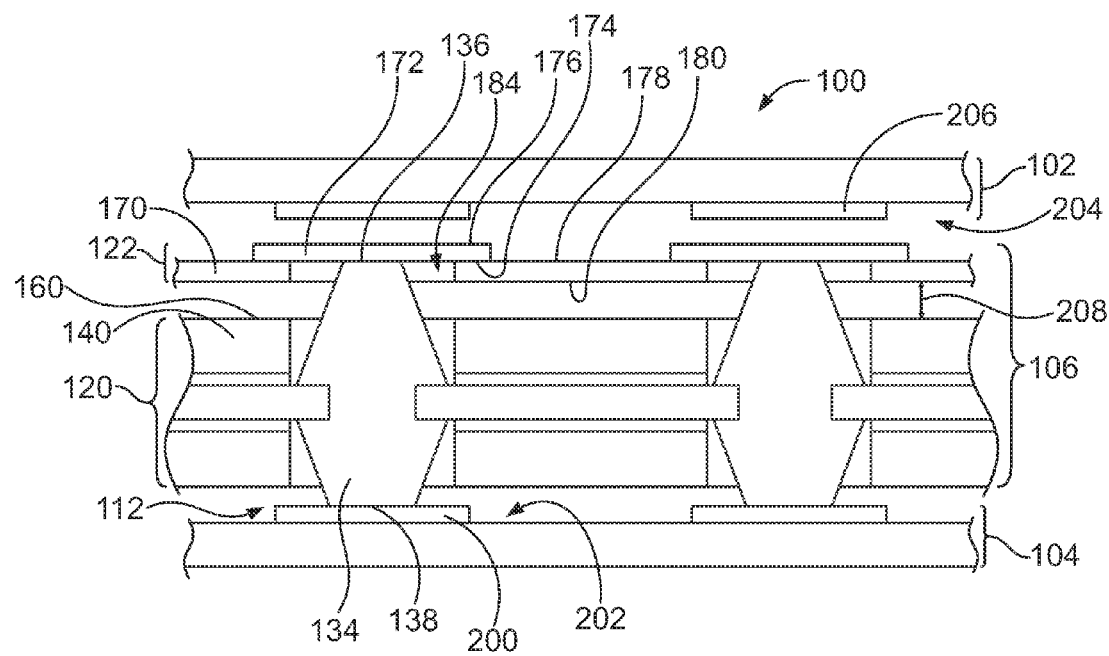
FIG. 5 is a cross-sectional view of the electrical interconnect system shown in FIG. 1 showing a first electrical component thereof in an unmated state.
Figure 6:
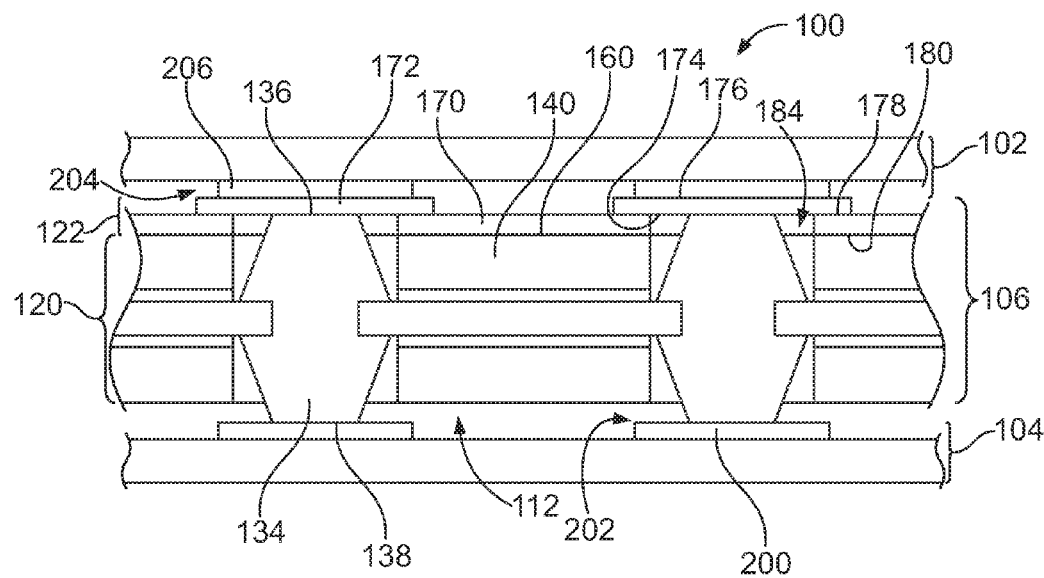
FIG. 6 is a cross-sectional view of the electrical interconnect system shown in FIG. 1 showing a first electrical component thereof in a mated state.
Figure 7:
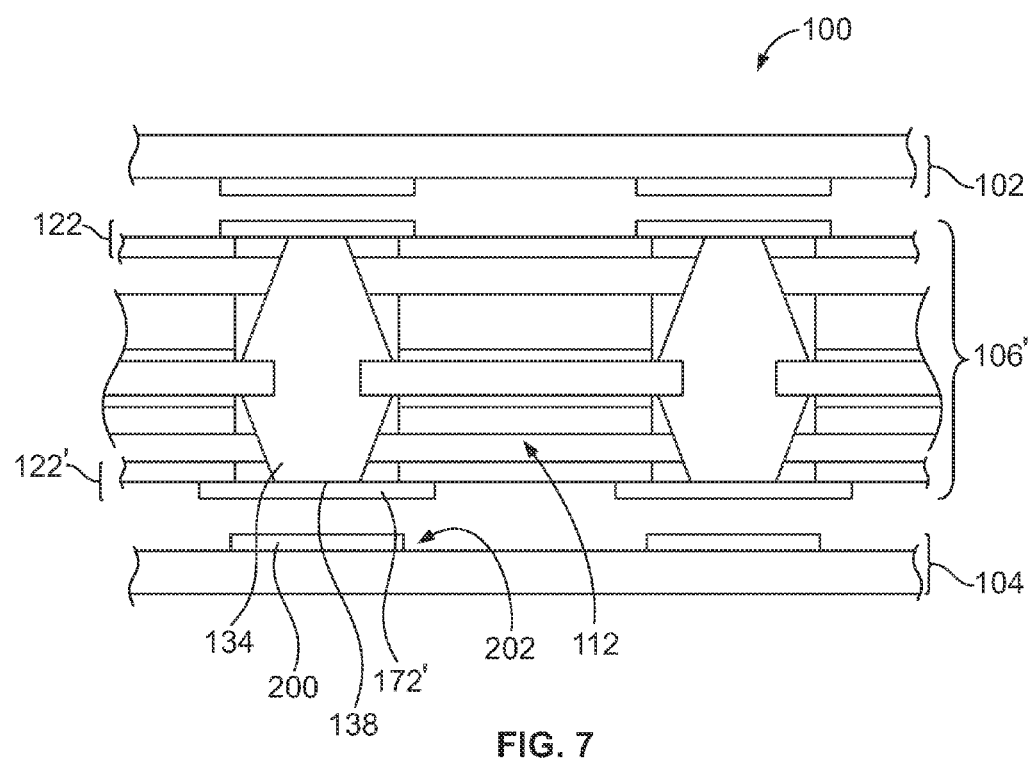
FIG. 7 is a cross-sectional view of the electrical interconnect system showing an electrical interconnect device having a first shield and a second shield.

FIG. 5 is a cross-sectional view of the electrical interconnect system 100 showing the first electrical component 102 in an unmated state. FIG. 6 is a cross-sectional view of the electrical interconnect system 100 showing the first electrical component 102 in a mated state. FIG. 7 is a cross-sectional view of the electrical interconnect system 100 showing an electrical interconnect device 106' having the first shield 122 and a second shield 122'. The interconnect device 106 is terminated to the second electrical component 104. In the illustrated embodiment, the interconnect device 106 is mounted to the second electrical component 104 such that the second ends 138 of the elastomeric columns 134 engage mating contacts 200 on a mating surface 202 of the second electrical component 104. The second ends 138 directly engage the mating contacts 200. In an alternative embodiment, with reference to FIG. 7, a second shield 122', similar to the shield 122, may be provided between the second mating surface 112 and the mating surface 202. The second ends 138 of the elastomeric columns 134 engage conductive pads 172' of the second shield 122' and the conductive pads 172' engage the mating contacts 200 of the second electrical component 104. In other alternative embodiments, contact caps or other metal contacts may be provided between the second ends 138 and the mating contacts 200. The interconnect device 106 may be secured to the second electrical component 104, such as by using latches, fasteners, or other means to mechanically hold the interconnect device 106 on the second electrical component 104.

The first electrical component 102 is configured to be removably coupled to the interconnect device 106 at a separable interface defined between the mating surface 204 of the first electrical component 102 and the shield 122. Preferably, the interconnect device 106 is configured for many mating and unmating cycles. For example, the first electrical component 102 may be readily mated and unmated from the interconnect device 106. In an exemplary embodiment, the interconnect device 106 defines a testing device that tests many different electrical components, such as electronic packages or chips. For example, the interconnect device 106 may define a burn-in socket used to test chips at high heat. The shield 122 defines a separable interface for mating with such electronic components. The conductive pads 172 may be mated and unmated from mating contacts 206 of the first electrical component 102 numerous times with minimal fatigue or damage to the outer surface 176 of the conductive pads 172. The conductive pads 172 do not bond or adhere to the mating contacts 206, such that the mating contacts 206 may be readily unmated from the conductive pads 172.

When the interconnect device 106 is assembled, the shield 122 is mounted exterior of the first outer surface 160 of the substrate 120. The elastomeric columns 134 extend beyond the outer surface 160 such that the first ends 136 are elevated above the first outer surface 160 of the coverlay 140. The elastomeric columns 134 are compressible and are configured to be compressed when the first electrical component 102 is mated to the interconnect device 106. FIG. 5 shows the first electrical component 102 in an unmated state, and the elastomeric columns 134 are illustrated at normal uncompressed positions. FIG. 6 illustrates the first electrical component 102 in a mated state, and the elastomeric columns 134 are illustrated at compressed positions.

When assembled, the shield 122 extends over the substrate 120 such that the conductive pads 172 are aligned with the elastomeric columns 134. The elastomeric columns 134 extend into the voids 184 such that the first ends 136 engage the inner surfaces 174 of the conductive pads 172. When the shield 122 is initially mounted to the substrate 120, the second surface 180 of the carrier 170 is spaced apart from the coverlay 140 such that a gap 208 is defined between the carrier 170 and the coverlay 140. When the first electrical component 102 is mated to the interconnect device 106, the first electrical component 102 presses against the first surface 178 of the carrier 170 and the mating contacts 206 press against the conductive pads 172. The force from the first electrical component 102 causes the elastomeric columns 134 to compress and shorten. The carrier 170 is pressed towards the coverlay 140 until the carrier 170 engages the coverlay 140. The carrier 170 is moved toward the coverlay 140 of the substrate 120, reducing the size of the gap 208 until the carrier 170 abuts the coverlay 140. The coverlay 140 and carrier 170 act as mechanical stops and do not allow the first electrical component 102 to press the elastomeric columns 134 any further.

When the first electrical component 102 is removed, the carrier 170 is released from the coverlay 140. After the first electrical component 102 is removed, the gap 208 is again provided between the carrier 170 and the coverlay 140. The conductive pads 172 remain engaged to the first ends 136 of the elastomeric columns 134. Optionally, during use of the electrical interconnect system 100, heat is generated which may cause the conductive pads 172 to bond to the first ends 136 of the elastomeric columns 134. The bond between the conductive pads 172 and the elastomeric columns 134 remains largely, if not entirely, undisturbed when the first electrical component 102 is removed from the interconnect device 106. The first ends 136 of the elastomeric columns 134 are not damaged or degraded during mating and unmating of the first electrical component 102 with the interconnect device 106.

In an alternative embodiment, the first electrical component 102 may have a ball grid array at the mating interface 204. The shield 122 may be rotated 180° so that the second surface 180 is upward facing. The voids 184 may also be upward facing to create a pocket for receiving the solder balls of the ball grid array of the first electrical component 102. The surfaces 176 of the conductive pads 172 may interface with the first ends 136 of the elastomeric columns 134.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electrical interconnect device comprising:
a substrate having opposite first and second outer surfaces;
an array of conductive elastomeric columns held by the substrate, each of the elastomeric columns having opposite first and second ends, the elastomeric columns being internally conductive between the first and second ends; and a shield mounted exterior of the first outer surface of the substrate, the shield having an insulative carrier having a first surface and a second surface, the first surface facing an electrical component configured to be coupled to the electrical interconnect device, the second surface facing the substrate, the carrier having voids extending between the first and second surfaces, the carrier holding an array of conductive pads on the first surface over corresponding voids and arranged in a complementary pattern as the array of elastomeric columns, the conductive pads having inner surfaces and outer surfaces, the inner surfaces facing the voids and elastomeric columns, the outer surfaces facing the electrical component, the shield positioned relative to the substrate such that the first ends of the conductive elastomeric columns are received in corresponding voids in the carrier such that the inner surfaces of the conductive pads engage the first ends of corresponding elastomeric columns, the outer surfaces being configured to engage corresponding mating contacts of the electrical component.

2. The electrical interconnect device of claim 1, wherein the conductive pads are formed on the carrier.

3. The electrical interconnect device of claim 1, wherein the conductive pads, the conductive pads having a void portion and a carrier portion, the void portion being aligned with corresponding voids, the carrier portion being aligned with portions of the carrier surrounding the void, the conductive pads being secured to the carrier at the carrier portions.

4. The electrical interconnect device of claim 1, wherein the shield is moveable relative to the substrate, the shield being moveable toward and away from the first outer surface as the conductive elastomeric columns are compressed and uncompressed.

5. The electrical interconnect device of claim 1, further comprising a second shield mounted exterior of the second outer surface of the substrate, the second shield having an insulative carrier holding an array of conductive pads engaging the seconds ends of corresponding elastomeric columns.

6. The electrical interconnect device of claim 1, further comprising alignment features extending from the substrate, the shield having shield alignment features engaging the alignment features to locate the shield with respect to the substrate.

7. The electrical interconnect device of claim 1, wherein the shield is mounted exterior of the first outer surface of the substrate such that a gap exists between the shield and the first outer surface, the shield being configured to float toward and away from the first outer surface to change the size of the gap as the electrical component is mounted to the electrical interconnect device.

8. An electrical interconnect device comprising:
a substrate having opposite first and second outer surfaces;
an array of conductive elastomeric columns held by the substrate, each of the columns having opposite first and second ends, the elastomeric columns being internally conductive between the first and second ends; and
a shield mounted exterior of the first outer surface of the substrate, the shield having an insulative carrier holding an array of conductive pads, the carrier having a first surface and a second surface, the conductive pads engaging the first ends of corresponding elastomeric columns such that the shield is supported by the elastomeric columns, the conductive pads being configured to engage corresponding mating contacts of an electrical component, the carrier floating above the first outer surface on the elastomeric columns such that the second surface moves closer to the first outer surface as the electrical component is connected to the electrical interconnect device and the elastomeric columns are compressed by the electrical component;
wherein the carrier includes an array of voids, the voids being aligned with corresponding conductive pads.

9. The electrical interconnect device of claim 8, wherein the conductive pads are held together by the carrier.

10. The electrical interconnect device of claim 8, wherein the conductive pads are formed on the carrier.

11. The electrical interconnect device of claim 8, wherein the elastomeric columns receive in corresponding voids to engage the conductive pads.

12. The electrical interconnect device of claim 8, wherein the conductive pads have a void portion and a carrier portion, the void portion being aligned with corresponding voids, the carrier portion being aligned with portions of the carrier surrounding the void, the conductive pads being secured to the carrier at the carrier portions.

13. The electrical interconnect device of claim 8, wherein the conductive pads are arranged on the first surface of the carrier, the carrier having voids extending between the first and second surfaces, the voids being aligned with corresponding conductive pads.

14. The electrical interconnect device of claim 8, further comprising a second shield mounted exterior of the second outer surface of the substrate, the second shield having a insulative carrier holding an array of conductive pads engaging the seconds ends of corresponding elastomeric columns.

15. An electrical interconnect system comprising:
a first electrical component having an array of contacts;
a second electrical component having an array of contacts; and
an electrical interconnect device electrically interconnecting corresponding contacts of the first and second electrical components, the electrical interconnect device comprising:
a substrate having opposite first and second outer surfaces,
an array of conductive elastomeric columns held by the substrate each having opposite first and second ends, and
a first shield mounted exterior of the first outer surface of the substrate, the first shield having an insulative carrier holding an array of conductive pads having inner surfaces and outer surfaces, the first shield positioned relative to the substrate such that the inner surfaces of the conductive pads engage the first ends of corresponding elastomeric columns, the outer surfaces being configured to engage corresponding mating contacts of the first electrical component; and
a second shield mounted exterior of the second outer surface of the substrate, the second shield having an insulative carrier holding an array of conductive pads having inner surfaces and outer surfaces, the second shield positioned relative to the substrate such that the inner surfaces of the conductive pads of the second shield engage the second ends of corresponding elastomeric columns, the outer surfaces of the conductive pads of the second shield being configured to engage corresponding mating contacts of the second electrical component to electrically interconnect the secondary first electrical component and the second electrical component.

16. The electrical interconnect system of claim 15, wherein the insulative carrier of the first shield includes a first surface and a second surface, the first surface facing the first electrical component, the second surface facing the substrate, the carrier of the first shield having voids extending between the first and second surfaces, the first shield being positioned relative to the substrate such that the first ends of the conductive elastomeric columns are received in corresponding voids in the carrier of the first shield to engage the conductive pads.

17. The electrical interconnect system of claim 15, wherein the first shield is movably coupled to the substrate, the shield being moveable toward and away from the first outer surface as the conductive elastomeric columns are compressed and uncompressed.

18. The electrical interconnect system of claim 15, wherein the first shield is mounted exterior of the first outer surface of the substrate such that a gap exists between the first shield and the first outer surface, the shield being configured to float toward and away from the first outer surface to change the size of the gap as the first electrical component is mounted to the electrical interconnect device.

* * * * *